(12) United States Patent
Kahn et al.

(10) Patent No.: US 6,862,495 B2
(45) Date of Patent: Mar. 1, 2005

(54) IN-SITU RANDOMIZATION AND RECORDING OF WAFER PROCESSING ORDER AT PROCESS TOOLS

(75) Inventors: Randolph W. Kahn, McKinney, TX (US); Kenneth G. Vickers, Whitesboro, TX (US); Richard L. Guldi, Dallas, TX (US); Edward J. Leonard, Richardson, TX (US); Yaojian Leng, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/727,722

(22) Filed: Dec. 4, 2003

(65) Prior Publication Data

US 2004/0111176 A1 Jun. 10, 2004

Related U.S. Application Data

(62) Division of application No. 09/997,930, filed on Nov. 30, 2001, now Pat. No. 6,684,125.
(60) Provisional application No. 60/259,310, filed on Dec. 31, 2000.

(51) Int. Cl.[7] .................................................. G06F 7/00
(52) U.S. Cl. ...................... 700/218; 414/801; 414/806; 414/937
(58) Field of Search .............................. 700/218, 213, 700/214, 121; 414/801, 806, 810, 936, 937, 938, 941

(56) References Cited

U.S. PATENT DOCUMENTS

| | | | |
|---|---|---|---|
| 5,183,370 A | 2/1993 | Cruz | |
| 5,761,065 A | 6/1998 | Kittler et al. | |
| 6,180,424 B1 | 1/2001 | Tigelaar et al. | |
| 6,213,708 B1 | 4/2001 | Allen | |
| 6,336,086 B1 | 1/2002 | Perez et al. | |
| 6,599,763 B1 | 7/2003 | Reyes et al. | |
| 6,684,125 B2 * | 1/2004 | Kahn et al. | 700/218 |

* cited by examiner

*Primary Examiner*—Khoi H. Tran
(74) *Attorney, Agent, or Firm*—Jacqueline J. Garner; W. James Brady, III; Frederick J. Telecky, Jr.

(57) ABSTRACT

Wafer order is randomized in-situ by use of a separate wafer staging area and randomly shuffling wafers to and from this staging area to shuffle the processing order of the wafer lot. Positional data is captured for each wafer at both the send and receive ends of the process.

4 Claims, 2 Drawing Sheets

IN-SITU RANDOMIZATION AND RECORDING OF WAFER PROCESSING ORDER AT PROCESS TOOLS

This is a divisional application of Ser. No. 09/997,930 filed Nov. 30, 2001 now U.S. Pat. No. 6,684,125 which is a non-provisional application of provisional application No. 60/259,310 filed Dec. 31, 2000.

BACKGROUND AND SUMMARY OF THE INVENTION

The present invention relates to integrated circuit structures and fabrication methods, and more particularly to wafer level yield analysis.

The economics of modern integrated circuit microfabrication are unusual. Every integrated circuit is tested at the end of manufacturing process, and a significant fraction of the integrated circuits must be discarded. (Typical yield loss may be a few percent to several tens of percent). Since the maximum number of wafers which can be processed per hour by the very expensive capital equipment is nearly fixed, the yield of good devices per wafer is a key determinant of profitability. This means that any improvement in yield is of great interest.

One of the key elements in yield optimization is fault analysis. Since there are numerous processing steps and machines which can cause yield loss, it is not necessarily obvious which processes are performing optimally and which are not. Test structures can indicate physical conditions, such as shorts, opens, degraded sheet resistance, or degraded contact resistance, but it still may not be apparent what, in the processing conditions, is leading to these physical conditions in the resulting structure. It is also very difficult to detect cooperative effects, where two processes are both out of tune in a way which combines with disastrous synergy.

An important recent innovation in fault analysis has been wafer randomization. Wafers are usually routed through a fab in lots of e.g. 25, and some fault analysis information can be derived from studying variation over time, or from lot-to-lot comparisons; but when the order of wafers within a lot remained fixed (as was formerly traditional), the information which could be derived from intralot comparison was minimal. For example, it was easy to observe (for example) that failure rates increased in the last half of a lot, but difficult to infer which machine might have been the source of this trend. However, by shuffling the order of wafers before critical processing steps, vastly more information could be derived from fault correlation analysis. (Mathematically, n wafer randomizations in a lot of k wafers allows multidimensional correlation and filtering operations, using an n+1-dimensional sequence vector.)

In order to take advantage of the fault correlation potential of wafer randomization, the wafer sequence data for each processing step must be retained. The simplest way to do this is by automatically validating the identity of every wafer before critical processing steps, and recording the resulting data. This provides the data for the sequence vector, and has the side benefit of preventing wafer mix-ups and potential misprocess scrap of mixed lots.

Also, since the spatial position of each wafer is consistently fixed at critical steps (since the machines normally reference the wafer notches or flats), fault analysis can (and should) also correlate trends to spatial locations on the wafer.

The input to this improved correlation capability is not limited to failures. Parametric data (e.g. from probe or device performance testing) can also be correlated back into the different stages in the process, to permit further optimization of yield (and optionally also performance).

A benefit of this is improved engineering productivity: process engineers can focus on leads from correlation analysis, instead of having to guess which step or combination of steps may be out of tune. The result is quicker and more efficient detection of lot yield problems. (A different way to think of this is that every production lot can also be analyzed as an experimental lot, WITHOUT any loss of yield or of production throughput.)

The original form Wafer Sleuth technology from Texas Instruments, used in combination with randomizer stations for wafer shuffling, provides many of these benefits. The present application implements further improvements in fault correlation, and in associated production steps.

In-Situ Randomization and Recording of Wafer Processing Order at Process Tool

The present application discloses an innovative way to randomize wafers in-situ during processing. The preferred embodiment is used with tools that have wafer pick and place capability, meaning they can select any wafer from a cassete rather than just accessing them in a particular order. Randomization of wafer order is provided by randomly pulling wafers from any slot on the send (incoming) cassette, or replacing wafers to a random slot in the receive (outgoing) cassette. Further randomization can be obtained by combining these methods.

In another embodiment, which uses a wafer tool with pick and place capability, wafers are completely randomized at the load and/or unlead stations prior to, or after, processing. This method reauires there be at least one empty slot for a wafer, or another wafer staging area available. This method is best used in a process where the time delay does not affect throughput, such as when the randomization is done while other wafers are occupying the needed tool.

In yet another embodiment, which applies to tools without pick and place capability, and for lot sizes of less than 25 (or the maximum number of wafer slots in the cassette holder, meaning free slots exist in the holder), wafers use a second temporary holding area, and wafers are pulled directly from the send cassette and either randomly stored or sent to processing. Wafers can then be pulled for processing randomly either from the next slot in the send cassette, or form the staging area. Wafers can also, at the receive end after processing, be randomly placed in the cassette or in a staging area, and wafers thereafter can be returned to the receive cassette either from the process tool or from the holding area.

In order to keep track of wafer processing order, the wafer number, or wafer ID, is read inside each processing tool. In the case of a multiple process chamber tool, the wafer number or ID is read at each process chamber. Note that both wafer ID and wafer order are tracked in the preferred embodiments. The resulting information about the sequence of wafers through each critical processing step can then be used for fault correlation.

Advantages of the disclosed methods and structures, in various embodiments, can include one or more of the following:

prevents wafer mixup from ex-situ shuffling;
reduces manufacturing time by eliminating separate randomization step;
saves fab floor space used for randomizers.

BRIEF DESCRIPTION OF THE DRAWINGS

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

The innovative concepts are described with reference to the preferred embodiment and the figures.

Advanced semiconductor yield analysis requires that the wafer processing order be known at every machine or processing chamber. Thus, if a machine has multiple processing chambers, the wafer processing sequence must be known at each chamber. In order for yield analysis to distinguish between different tools, the wafer processing order is randomized. This makes it easier to trace systematic defects in wafers back to the tools which caused them.

In the preferred embodiment, the wafers are randomized in-situ. This is done by modifying the programming of the loading function for the cassettes that hold the wafers. Tools with pick and place capability (i.e., access to any slot in the cassette at any time, rather than accessing the slots sequentially only) can have their readers upgraded and/or software upgraded to perform the randomization and wafer tracking that is necesary for practicing the invention, including randomization and wafer tracking tasks.

There is typically a send cassette and a receive cassette. The send cassette contains incoming wafers going to the tool, and the receive cassette contains outgoing wafers coming from the tool. The wafer numbers are read inside the actual process tool. In the case of multiple chambers inside a tool, the wafer numbers are read in each chamber. This allows the sequence of wafers to be known at the tool or the individual chambers, as needed.

Except where noted, the following discussion refers to single processing chamber tools. However, it should be understood that the same concepts can be applied to multiple chamber tools, as discussed further below.

In the preferred embodiment, wafers are randomized in-situ. A wafer tool with pick and place capability is used. Wafer randomization is provided at either the send cassette, the receeive cassette, or both. Wafers are randomly pulled from any slot on the send cassette and sent on for processing. This privides one level of randomization for the wafer order. Wafers may also be randomly placed in any open slot in the receive cassette after processing, which provides another layer of randomization. Wafers may also be randomized at both the send and receive cassettes, further randomizing the order. Positional data and wafer ID are captured for both the send and receive cassettes.

Figure 1:
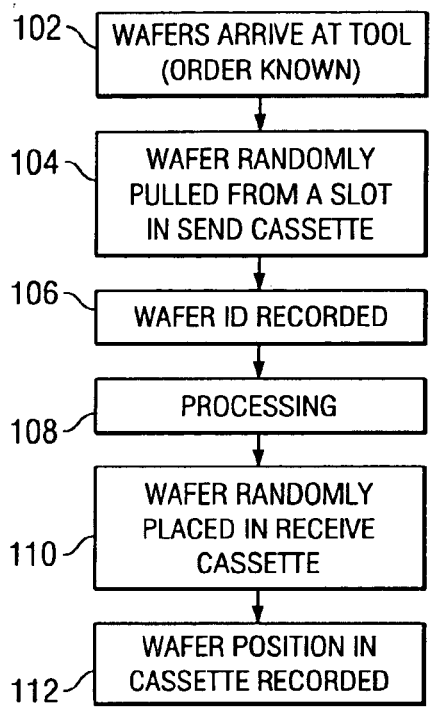
FIG. 1 shows a flow chart for key steps in the innovative wafer fabrication process.

FIG. 1 shows a process flow for the innovative randomization technique. The wafers arrive at the process tool, their order in the cassette known (step 102). A wafer is randomly pulled from a slot in the send cassette (step 104). The wafer's ID is recorded (step 106) and the wafer is processed in the tool (step 108). The wafer is then randomly poaced in an available slot in the receive cassette (step 110), and the wafer's position in the cassette is recorded (step 112). This example flow uses randomization at both ends of the process (send and receive). It should be noted that either randomization alone will provide sufficient randomization, and both randomization techniques need not be used simultaneously.

In another embodiment, the wafer order is completely randomized at the load and/or the unload stations prior to (or after, in the unload station's case) processing. This requires at least one empty slot in the cassette, or another wafer staging area to be available (such as a temporary holding cassette, for example). Again, the wafer ID and positional data are captured at at least one process point that allows the wafers to be tracked by software both into and out of the tool. This option is preferable in a process where a delay for randomization will not affect throughput or cycle time, such as when another lot is undergoing processing.

Figure 2:
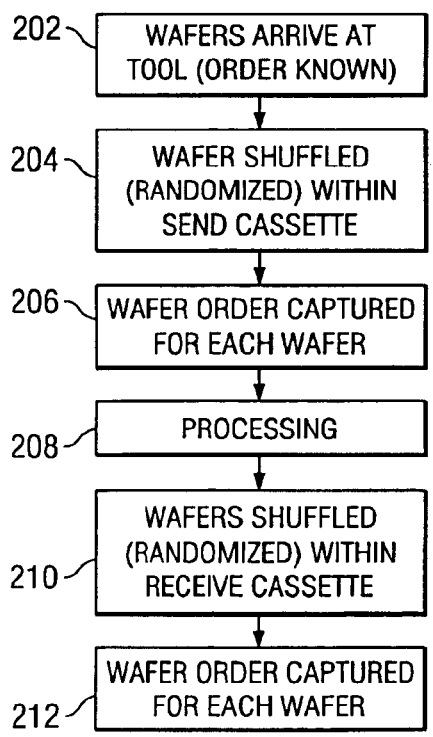
FIG. 2 shows a flow chart for key steps in the innovative wafer fabrication process.

FIG. 2 shows a flowchart with key steps to the innovative process the wafers arrive at the processing tool in the send cassette (step 202), their order known. The wafers are then entirely randomized by shuffling them within the send cassette using a tool with pick and place capability (step 204). The wafer order within the send cassette is then captured (step 206). It should be noted that the wafer ID may be captured within the process tool itself, depending on the implementation used. The wafer undergoes processing (step 208). Once all wafers are processed, the wafer order within the receive cassette is again randomized by the pick and place tool (step 210), and the wafer order is again captured (step 212).

It should be noted that the above two embodiments mentioned may be combined to provide even more thoroughly randomized wafer lots, though the cost in time and implementation may make such a combination undesireable.

For a tool without pick and place capability (i.e., for tools that can only access wafers by retracting or replacing wafers below actual product wafers, not above them), and on lot sizes of 25 wafers or less (i.e., a small enough lot to fit into a single wafer cassette), a second temporary holding cassette is used to randomize wafer order once the send cassette is inside the tool. (Note that any separate wafer staging area could also be used.) Wafers pulled directly from the send cassette can either be randomly stored in the holding cassette or sent on for processing. The random selection of whether to shelve a wafer or send it directly to processing shuffles the wafers, allowing wafer analysis to distinguish different tools. The processing order of the wafers is recorded in the processing tool (or at each individual chamber in multichamber tools).

Instead of pulling wafers only from the send cassette, once there are wafers in the holding cassette the loading tool can randomly pull wafers either from the send cassette or the holding cassette. This further randomizes wafer order.

After processing, the wafers may be randomly returned to either the receive cassette or a second hold cassette (or other wafer staging area). Thus, after processing, a given wafer may either go directly into the receive cassette, or it might go to the hold cassette. Once there are wafers in the hold cassette, wafers may be randomly returned to the receive cassette either directly from processing, or from the holding cassette. (In the preferred embodiment, all wafers must end up in the receive cassette.) This adds another shuffling step to the wafer order. The positional data for the wafers is recorded so that the wafer order is known once all wafers are in the receive cassette. (In the preferred embodiment, the positional data is captured for both the send and/or the receive wafer order.)

Figure 3:
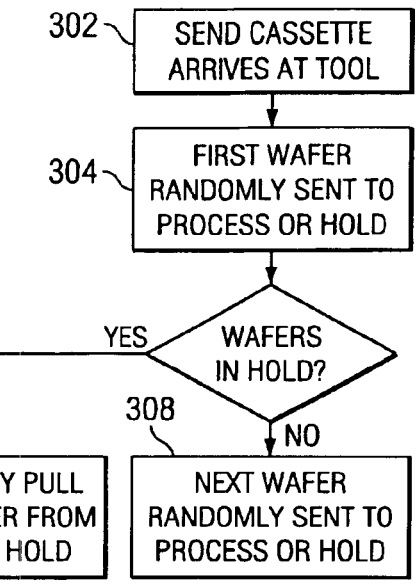
FIG. 3 shows a flow chart for key steps in the innovative wafer fabrication process.

FIG. 3 shows a flow chart of an embodiment of the present innovations. When a wafer send cassette arrives at a processing tool (step 302), the top wafer of the lot (for a tool without pick and place capability) is removed and randomly sent either to processing or to a temporary wafer staging area (step 304). Once there are wafers in the staging area, wafers may be pulled randomly from either the send cassette or from the staging area and sent to processing (step 306). This choice adds further randomization to the wafer order. If there are no wafers in the staging area, then the next wafer from the send cassette is randomly sent either to processing or to the wafer staging area (step 308). The process is continued until all wafers have been sent to processing. Note that the wafer order is captured as they enter the processing tool or chamber, depending on the configuration of the tool.

Figure 4:
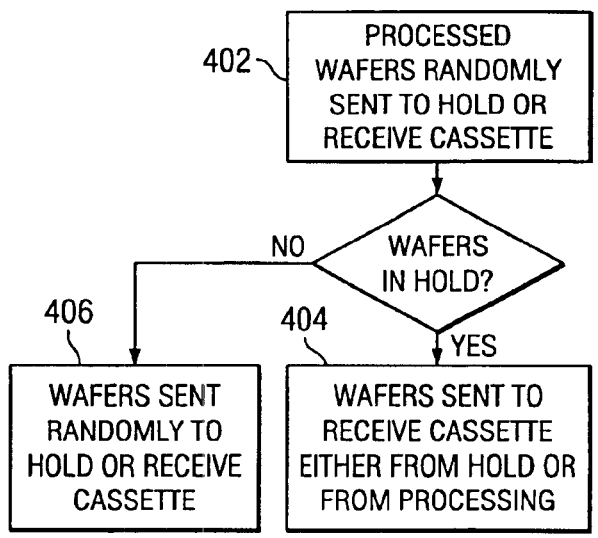
FIG. 4 shows a flow chart for key steps in the innovative wafer fabrication process.

FIG. 4 shows a flow chart for when the wafers complete processing in the tool's process chamber. Processed wafers are returned at random to either the receive cassette or to a separate wafer staging area (step 402). Once there are wafers in the wafer staging area, then wafers are sent to the receive cassette, at random, from either the process chamber or from the wafer staging area (step 404). This adds further randomization to the wafer order. If there are no wafers in the wafer staging area, then wafers are pulled from processing and sent at random to either the receive cassette or to the wafer staging area (step 406). Note that this process continues until all wafers are in the receive cassette. The wafer order is captured (by recording wafer IDs) for the final wafer position in the receive cassette wafer ID capture can be accomplished, for instance, by scanners and bar codes on the wafers, or other computer readable means. In the preferred embodiment, the wafer ID si captured through hardware modifications by installing OCR (optical character reader), laser, or CCD based barcode scanners or CCD based 2D readers. The readers are strategically located in the tool where there is only one wafer ID capture needed per wafer, and the rest of the tracking is done through software. The positional and process order data requires software upgrades to incorporate it into a process, where the host system for the wafer fab tool keeps track of the wafer history and stores information locally or sends information over the LAN through a communication protocol.

Figure 5:
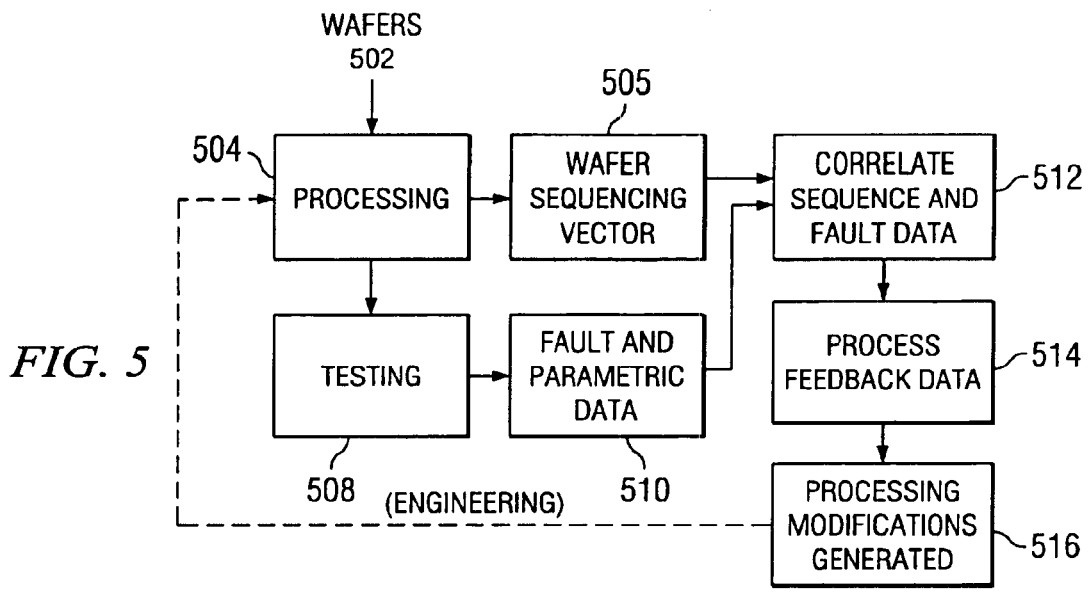
FIG. 5 shows a wafer process that incorporates the preferred embodiment.

FIG. 5 shows a wafer process that incorporates the preferred embodiment. Wafers 502 are introduced to front end processing 504, which includes at least one, usually several, front end process steps. In the preferred embodiment the wafer order is randomly shuffled at critical process steps where defect generation is possible or likely. The wafer order is recorded and tracked throughout these steps, generating a wafer sequencing vector 506 that contains the wafer order information at any given point in the process. After processing, the wafers go through testing 508, which generates fault and parametric data 510. Next, the innovative process generates a correlation 512 of the sequence data with the fault data to generate process feedback data 514. This data is used by engineering to generate modifications 516 to the process aimed at reducing the defects detected in the wafers.

Figure 6:
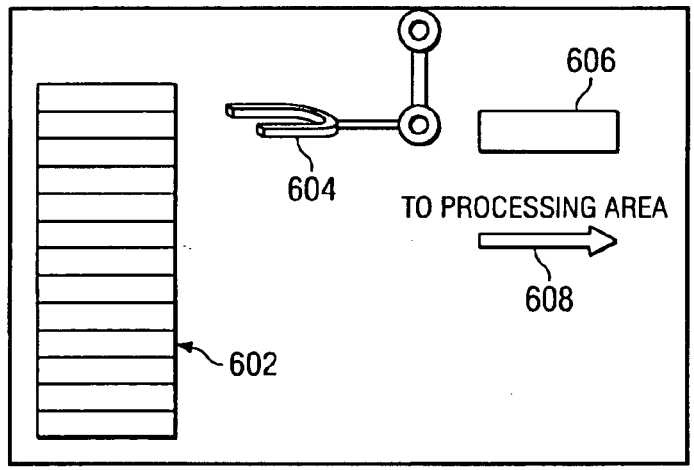
FIG. 6 shows an innovative process tool that randomizes the wafers.

FIG. 6 shows an innovative process tool that randomizes the wafers. A wafer send cassette 602 has slots for individual wafers, and an arm 604 that moves the wafers. The tool may be capable of pick-and-placing the wafers anywhere, or in other embodiments can only access wafers in a particular order. A wafer staging area 606 may be used for shuffling the wafers. In this example, incoming wafers are shuffled before going to the processing area 608, or outgoing wafers are shuffled as they are placed in (in this case) the receive cassette 602.

Figure 7:
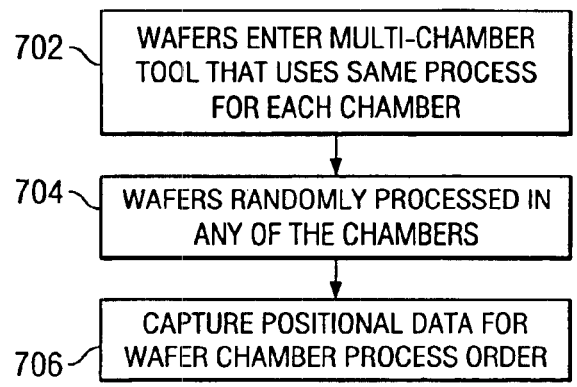
FIG. 7 shows a flowchart for another embodiment.

FIG. 7 shows a flowchart for another embodiment. For a multi-chamber tool that uses the same process for each chamber, wafers can be randomly processed in any of the chambers the wafers enter the multi-chamber tool (step 702), and are randomly processed in any of the chambers (step 704). Positional data is captured for the wafer chamber process order (step 706).

Another embodiment applies to processing tools with multiple processing chambers that use the same process for each of its chambers. For such a tool, each of the wafers can be randomly processed in any of the chambers. Of course, the positional data must be captured for the wafer chamber process order.

Automatic wafer randomization coupled with wafer number reading at the process chamber or tool helps prevent uncertainty due to wafer mix-up between the reading of wafer order (which typically occurs ex-situ in a separate apparatus) and actual processing. It also reduces manufacturing time by eliminating the separate randomization and read step. This also allows the randomizer apparatus to be eliminated from the fab floor space. One randomizer typically occupies 4 square feet of extremely expensive fab floor space. A sorter occupies 9 square feet. A typical fab may have 50 randomizers.

The innovative in-situ ramdomization and tracking method also reduces defect density by eliminating an extra wafer handling step. Implementation of these innovative concepts in some cases requires only software modification.

According to a disclosed class of innovative embodiments, there is provided: A method of wafer processing, comprising the steps of: when a wafer lot arrives at a processing tool in a send cassette, randomizing said lot by transporting individual wafers thereof variously, within said tool, from said cassette either to a processing position or to a wafer staging area. Also provided is a processing tool which is programmed to perform this method.

According to another disclosed class of innovative embodiments, there is provided: A method of wafer processing, comprising the steps of: when a wafer lot arrives at a processing tool in a send cassette, randomizing said lot by transporting individual wafers thereof variously, within said tool, from said cassette to a processing position, or from said cassette to a wafer staging area, if said wafer staging area is empty, or from said wafer staging area to said processing position. Also provided is a processing tool which is programmed to perform this method.

According to another disclosed class of innovative embodiments, there is provided: A method of wafer processing, comprising the steps of: when a wafer lot arrives at a processing tool in a send cassette, randomizing said lot by transporting individual wafers thereof variously, within said tool, from said cassette either to a processing position or to a wafer staging area. Also provided is a processing tool which is programmed to perform this method. According to another disclosed class of innovative embodiments, there is provided: Also provided is a processing tool which is programmed to perform this method.

According to another disclosed class of innovative embodiments, there is provided: A method of wafer processing, comprising the steps of: randomizing a wafer lot by transporting individual wafers thereof variously, within a processing tool, from a processing position to a wafer cassette, from a wafer staging area to a wafer cassette, or from said processing position to said wafer staging area. Also provided is a processing tool which is programmed to perform this method.

According to another disclosed class of innovative embodiments, there is provided: A fabrication method, comprising the steps of: varying the history of wafers within a lot by transporting individual ones thereof within a processing tool with multiple processing chambers, among said chambers and wafer cassette and/or staging locations in various different sequences. Also provided is a processing tool which is programmed to perform this method.

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

Alternatively, it is possible to adapt the disclosed in-situ shuffling methods to tools which do not capture wafer identification and sequence, but instead follow a predetermined algorithm. However, this is less desirable, since such an architecture is more vulnerable to unrecorded changes in wafer sequence due to manipulation by engineers or technicians.

The wafer order can be randomized at non-ctritical steps as well as critical steps. Also, the wafer order, instead of being randomly ordered by the innovative tool, may instead be set to a reorder the wafers into a particular sequence. This variation is useful, for instance, where there are particular points in the process where mere randomized wafer order may not accentuate defects, or may not indicate at exactly which process step the faults were generated. By selecting a particular order for the wafers, or by selecting sets of particular orders for the wafers at selected process steps, fault generating steps can more easily be identified.

The innnovation of the present application are also applicable in processes where some wafer randomization is done ex-situ, some done in-situ. Wafer order data must of course be known at all phases.

Additional general background, which help to show the knowledge of those skilled in the art regarding variations and implementations of the disclosed inventions, may be found in the following documents, all of which are hereby incorporated by reference: Coburn, PLASMA ETCHING AND REACTIVE ION ETCHING (1982); HANDBOOK OF PLASMA PROCESSING TECHNOLOGY (ed. Rossnagel); PLASMA ETCHING (ed. Manos and Flamm 1989); PLASMA PROCESSING (ed. Dieleman et al. 1982); Schmitz, CVD OF TUNGSTEN AND TUNGSTEN SILICIDES FOR VLSI/ULSI APPLICATIONS (1992); METALLIZATION AND METAL-SEMICONDUCTOR INTERFACES (ed. Batra 1989); VLSI METALLIZATION: PHYSICS AND TECHNOLOGIES (ed. Shenai 1991); Murarka, METALLIZATION THEORY AND PRACTICE FOR VLSI AND ULSI (1993); HANDBOOK OF MULTILEVEL METALLIZATION FOR INTEGRATED CIRCUITS (ed. Wilson et al. 1993); Rao, MULTILEVEL INTERCONNECT TECHNOLOGY (1993); CHEMICAL VAPOR DEPOSITION (ed. M. L. Hitchman 1993); and the semiannual conference proceedings of the Electrochemical Society on plasma processing.

What is claimed is:

1. A method of wafer processing, comprising the steps of:
   randomizing a wafer lot by transporting individual wafers thereof variously,
   within a processing tool,
   from a processing position to a wafer cassette,
   from a wafer staging area to a wafer cassette,
   or from said processing position to said wafer staging area.

2. The method of claim 1, further comprising the contemporaneous step of recording process sequence data for said wafers.

3. The method of claim 1, further comprising the subsequent step of correlating fault and/or parametric data with process sequence data resulting from said randomization step.

4. The method of claim 1, further comprising the subsequent step of correlating fault and/or parametric data with process sequence data resulting from said randomization step, and controlling process parameters accordingly.

* * * * *